United States Patent [19]

Dustin

[11] Patent Number: 5,091,287
[45] Date of Patent: Feb. 25, 1992

[54] PHOTOREACTIVE OLIGOMER COMPOSITION AND PRINTING PLATE

[75] Inventor: Daniel S. Dustin, Minneapolis, Minn.

[73] Assignee: Minnesota Mining and Manufacturing Company, St. Paul, Minn.

[21] Appl. No.: 506,905

[22] Filed: Apr. 10, 1990

[51] Int. Cl.$^5$ .......................... G03F 7/30; G03F 7/038
[52] U.S. Cl. ..................................... 430/302; 430/309; 430/284; 430/278; 430/325; 522/90; 522/63; 525/502; 525/920; 526/301; 528/75
[58] Field of Search ............... 525/502, 920; 526/301; 528/75; 522/90, 63; 430/284, 278, 325, 302, 309

[56] References Cited

U.S. PATENT DOCUMENTS

| | | | |
|---|---|---|---|
| 3,644,289 | 2/1972 | Sayigh et al. | 525/502 X |
| 3,928,299 | 12/1975 | Rosenkranz et al. | 522/90 |
| 3,987,037 | 10/1976 | Bonham et al. | 522/63 X |
| 4,189,323 | 2/1980 | Buhr | 522/63 X |
| 4,316,949 | 2/1982 | Petrellis et al. | 430/159 |
| 4,448,951 | 5/1984 | Rupert et al. | 528/129 |

FOREIGN PATENT DOCUMENTS

| | | |
|---|---|---|
| 3630954 | 3/1988 | Fed. Rep. of Germany . |
| 3630995 | 3/1988 | Fed. Rep. of Germany . |
| 3630996 | 3/1988 | Fed. Rep. of Germany . |

*Primary Examiner*—Cynthia Hamilton
*Attorney, Agent, or Firm*—Gary L. Griswold; Walter N. Kirn; Gregory A. Evearitt

[57] ABSTRACT

Disclosed are novel dry, non-tacky photopolymer precursors or isocyanate-free urethane oligomers which are the reaction products of heat reactive phenolic resins and unsaturated monoisocyanates, e.g. a methylol containing resole and isocyantoethyl methacrylate. The reaction product combined with a haloalkyl triazine photosensitizer and an inert organic solvent provides an excellent coating for a variety of substrates used in the printing and publishing industry, e.g. grained, anodized aluminum lithoplates. The presensitized lithographic plates can be used in aqueous alkaline based development processes and exhibit an increased resistance to solvent attack during the development and printing processes.

8 Claims, No Drawings

PHOTOREACTIVE OLIGOMER COMPOSITION AND PRINTING PLATE

FIELD OF THE INVENTION

This invention relates to urethanes and their use as coatings in the printing and publishing arts. More particularly, this invention relates to the condensation products of heat reactive phenolic resins and olefin unsaturated monoisocyanates and their use as photopolymer precursors in various coatings.

BACKGROUND OF THE INVENTION

Lithographic plates (also called lithoplates or printing plates) are sheet-like articles with metal, paper, or plastic substrates that have been cleaned, treated, and coated with a thin film of a light-sensitive material. This material is typically naturally soluble in some solvents, such as water, but becomes insoluble thereafter upon exposure to light. A photoimage is formed on the plate by placing a negative or positive image in close contact with the coated plate and then exposing the plate to a controlled light source such as ultraviolet light. The light passes through the positive or negative thereby polymerizing the coating and rendering the light exposed portion insoluble. The portions of the coating which remain shaded by the opaque portions of the negative or positive, and thus which are not exposed to light, remain soluble. Afterwards, the plate is usually developed in either an alcohol/water or an aqueous alkaline developing solution to remove the unexposed non-image portions from the plate The film coating of light sensitive material mentioned above typically contains a polymeric backbone. The strength of the polymeric backbone is important because if it tends to be weak, the developing solution will degrade it and the quality of the developed image will be drastically lowered. Furthermore, the coating will be susceptible to solvent attack and further degradation during the on-line printing process.

In the past, such coatings have typically involved two separate layers, e.g. an oligomeric diazonium resin layer with an undercoat containing a urethane moiety. See, for example, U.S. Pat. No. 4,316,949. The undercoating was necessary in order to achieve adhesion of the image areas to the aluminum plate. Such bilayered coatings, though, present some drawbacks. First of all, if the urethane-based moieties are not polymerized enough, they will be susceptible to degradation by developing solutions, thereby hampering the quality of the developed photoimage. An additional drawback to such coatings is the high degree of tackiness they possess due to the use of viscous diols in the reaction process with diisocyanates to make urethanes. The viscous coating will quite often require the presence of a separate surface coating, such as polyvinyl alcohol, to detackify the urethane undercoating. If the undercoating is not detackified, it will be difficult to remove the negative from the presensitized plate. Furthermore, the presensitized plates would tend to stick to one another during the production process if the extra surface coating was not present.

Although specialized urethane-based coatings have been developed for applications other than in lithography, such as for use in the circuit and cable industries, these coatings would not necessarily be suitable for use in coating lithographic plates. For example, DE 3630954; DE 3630995; and DE 3630996 disclose protective coatings for circuit boards and the like which are the reaction products of olefin unsaturated monoisocyanates and novolak resins. Because novolak resins are generally non-heat reactive, there is not a great amount of cross-linking of the urethane reaction product. Consequently, these urethanes would not be suitable for use as coatings in lithographic articles since they would not serve as a strong backbone and thus would be susceptible to degradation by the developing solutions. Additionally, the polymeric material would be susceptible to further degradation by various solvents during the on-line printing process.

Many of the existing photosensitive precursors or oligomers, e.g. urethanes, are compatible primarily with only diazonium photosensitizers and alcohol/water developing solutions, both of which present drawbacks in their use. Diazo-based plates have a limited shelf life because the diazo compounds can degrade the aluminum plates and therefore require a silicated barrier coating between the diazo coating and the aluminum backing member. In addition, the diazo coatings present handling problems by reason of their sensitivity to heat, moisture, and tungsten light. The use of alcohol/water based developing solutions present both environmental and safety problems. Thus, there has been a preference in the industry for photopolymer precursors which are compatible with halomethyl-s-triazine-type photosensitizers and aqueous alkaline developing solutions.

In view of the foregoing, what is needed in the industry are photopolymer precursors which are non-tacky, easy to apply, and which have sufficient strength to resist degradation during both the development and on-line printing processes. Additionally, the photopolymer precursors should be compatible with the particular photosensitive compounds and developing solutions which are becoming increasingly used within the lithographic field.

SUMMARY OF THE INVENTION

The present invention is directed to novel urethane oligomers, coating compositions prepared therefrom, and presensitized lithoplates coated with the coating compositions. Also provided is a process for developing a photoimage formed on the presensitized plate.

The non-tacky, durable, film-forming urethane oligomers of the present invention are prepared by reacting heat reactive phenolic resins and olefin unsaturated monoisocyanates, e.g. the reaction product of a resole with isocyantoethyl methacrylate. The reaction product will be a urethane free of any isocyanate groups.

The inventive film-forming urethane oligomer is non-tacky and therefore, does not require the addition of a second film-forming resin to detackify it. Because the inventive oligomer is produced from a heat reactive oligomer, the urethane-based product will contain a much higher degree of cross-linking compared to previous oligomers. Consequently, it will be less susceptible to solvent attack during both development and the on-line printing processes.

The novel coating compositions of this invention comprise non-tacky, isocyanate-free, urethane oligomers and haloalkyl triazine-containing photosensitizers. The inventive coating compositions do not contain diazonium sensitizers and therefore, do not possess the drawbacks associated with the use of those materials. Furthermore, since the inventive coating composition consists of only one layer, it is not cumbersome to apply it to a variety of supports (such as anodized aluminum) in the production of a presensitized plate.

The presensitized plates of the present invention can be used in a process to develop a photoimage. Briefly, this process comprises exposing a supported, light sensitive coating composition, as described above, to light under a pattern and then developing the resulting image with an aqueous alkaline solution. The use of the aqueous system precludes the drawbacks associated with alcohol based systems. In a preferred embodiment, the coated plate is post-cured after development, thereby further cross-linking the urethane polymer which will increase its resistance to ink solvents used in cleaning printing presses.

Other aspects and advantages of the present invention will become apparent from the detailed description and the examples.

DETAILED DESCRIPTION OF THE INVENTION

The novel urethane oligomers of the present invention are the reaction product of a heat reactive phenolic resin and an unsaturated monoisocyanate.

As used herein, the term "heat reactive phenolic resin" refers to resins which are characterized by their terminal methylol ($-CH_2OH$) groups which are capable of further reaction through condensation when subjected to elevated temperatures, e.g. 400° F. By contrast, non-heat reactive phenolics contain no methylol groups and are, therefore, inert to further condensation.

Typically, the heat reactive phenolics are known as resoles whereas the non-heat reactive phenolics as known as novolaks. Resoles are well known in the art and are prepared by the acid or base catalyzed reaction of phenol with excess formaldehyde. In the present invention, the heat reactive phenolics are preferably acid catalyzed because the polymer produced is chain extended rather than having multiple methyol groups on one ring which tend to make the phenolic resin rather unstable Examples of commercially available heat reactive resins which may be used in the present invention include, but are not limited to, CK-1282, CK-1636, BK 5918, BKR 2620, BKS-2600, and BKS-2700 (Union Carbide Corporation); VARCUM TM 29-802 (Reichold Chemical Company); and BRJ-473 (Schenectady Chemicals).

Unsaturated monoisocyanates, which are the other reactants used in the present invention, are known. See, for example, U.S. Pat. Nos. 2,718,516 and 2,821,544. Preferred in the present invention are those monoisocyanates which are acrylated such as isocyanatoethyl methacrylate. The unsaturation is necessary in the present invention so that the urethane oligomers will cross-link with one another upon exposure to light or heat, thereby creating a strong polymeric backbone.

The reaction conditions for formation of urethanes are well known in the art, with the reaction taking place between the isocyanate and the hydroxyl group of the phenol. In the present invention, the methylol group of the heat reactive phenol will also react with the monoisocyanate. The organic solvents employed as the reaction medium should be completely inert toward the monoisocyanate. Examples of suitable solvents include tetrahydrofuran, dioxane, acetone, and methyl ethyl ketone, with the latter preferred. The reaction will take place at room or reflux temperature. Usual catalysts for the isocyanate reaction, such as dibutyltin diacetate or dibutyltin dilaurate, are optional. The reaction is monitored to completion by the disappearance of the $-N=C=O$ absorption as shown by infra-red spectrometry. Thus, the reaction product after isolation by solvent extraction or other conventional methods is a novel, non-tacky, dry film forming photopolymer precursor or urethane oligomer which is free of isocyanate groups.

Preferably, the molar ration (solids content) of the heat reactive phenolic resin to the unsaturated monoisocyanate in the reaction will be about 1:0.50–1.25.

The foregoing disclosed photopolymer precursors or oligomers can be combined with a photosensitizer and optionally, a colorant or dye, in an inert organic solvent to form a coating solution which can be applied to various supports used in the lithographic process.

The haloalkyl triazine photosensitizers utilized in the present invention, such as the styrlhalomethyl-s-triazines, are all well known in the art. See, for example, U.S. Pat. No. 3,954,425. These types of photosensitizers are capable of free-radical generation upon excitation with actinic radiation such as ultraviolet light.

Conventional dyes or colorants in the lithographic industry, such as an oil soluble blue dye, may optionally be used in the present invention.

The novel coating composition of the present invention is prepared by dissolving the urethane oligomer reaction product in an inert organic solvent such as acetone, methyl ethyl ketone, methylcellosolve, methocellosolve acetate, and tetrahydrofuran along with the haloalkyl triazine photosensitizer and optionally, the colorant or dye.

Preferably, the total solids content of the coating solution will be about 20 wt. %. From about 3 wt. % to 10 wt. % of the photosensitizer is used based upon the weight of the urethane oligomer. When utilized, the colorant or dye will be present in the coating solution in an amount of about 1% of the total solids content.

Although the coating solutions of the present invention are especially suitable for application to lithoplates such as anodized, unsilicated, aluminum sheets, one skilled in the art will realize that the coating solutions could be applied to substrates made from a variety of materials, e.g., polyesters, polyimides, cellulose triacetates, metals, metal-paper laminates, and silk screens. The coated substrates could then be used in either lithographic, color proofing, silk screen printing, or other processes as appropriate.

A presensitized lithoplate can be prepared by applying the coating solution onto a suitable base sheet or substrate, preferably a grained, anodized, unsilicated aluminum sheet. Since the present invention does not employ diazo based photosensitizers, a silicated barrier coating is not needed to protect the base sheet or substrate. The coating may be applied, e.g. by immersion or casting or draining or by casting and centrifuging off the excess of the solution, by brushing, by swabbing by roller-coating or by any other known method of application. The applied coating is then dried at room temperature or at an elevated temperature, e.g. 200° F.

In the development process, the presensitized lithoplate is exposed to actinic radiation, such as ultraviolet light, under a positive or negative pattern. As a result, a latent image is formed on the lithoplate. The light exposed portions of the coating photopolymerize in the dry state and become solvent insoluble whereas the unexposed portions of the plate do not photopolymerize and therefore remain solvent soluble. Afterwards, the plate is contacted with the aqueous alkaline development solution, e.g. sodium metasilicate. The photoimage containing portions of the lithoplate will remain and the non-image portions can be treated or washed away with solvent.

In a preferred embodiment, the developed lithoplates are post-cured by heat treatment at about 450° F. for 10 minutes. This helps to further cross-link the urethane polymer through both the vinyl or unsaturated groups of the urethane reaction product and the methylol groups of the phenolic-derivative. The post-cured polymeric backbone containing the developed image will be even more resistant to solvent degradation during the on-line printing process.

Lithographic printing plates prepared with the non-tacky coatings of this invention show long press lives and high resistance to degradation by aqueous-alkaline developers.

The following non-limiting examples further illustrate the present invention.

EXAMPLE 1

This Example illustrates the preparation of an isocyanate-free, urethane oligomer solution.

To a stirred solution of 24.1 grams BK-5918, a heat reactive phenolic resin from Union Carbide Corp., 100 grams dry methyl ethyl ketone and 1 gram dibutyltindiacetate, 31 grams isocyanatoethyl methacrylate was added dropwise over 15 minutes at room temperature. An exothermic reaction occurred and the temperature rose to 36° C. The reaction was followed by infra-red spectroscopy for the disappearance of the isocyanate functionality at 2260(cm$^{-1}$). The reaction was complete in 2 hours.

EXAMPLE 2

A photosensitive composition for use in a lithographic plate construction was formulated using the following components at the indicated parts by weight.

| Component | Parts |
|---|---|
| Urethane solution from Example 1 | 10 |
| methyl ethyl ketone | 10 |
| 2-(p-hydroxyethoxy styryl)-4,6-bis(trichloromethyl)-s-triazine | 0.2 |
| ERO Blue (Color Index Solvent Blue 102) | 0.05 |

A grained, anodized, unsilicated aluminum plate was coated with the photosensitive composition to a coating weight of 220±20 mg./ft$^2$ with a wire wound coating bar and oven dried 2 minutes at 160° F.

The resulting photopolymer lithographic plate was exposed through a half-tone negative on a commercial ultraviolet emitting exposure frame. The plate was then developed in a developing solution consisting of 2% sodium metasilicate pentahydrate, 3% benzyl alcohol, and 4.3% Pelex NBL (KOA Corporation) (38% in water). The non-exposed areas of the plate were removed with light scrubbing to give a developed image.

A press test plate was prepared for comparative testing as described above and following exposure and development, was rinsed and wiped dry. The dry plate was treated with a 6% aqueous solution of disodium (dodecyl diphenylether) disulfonate and wiped dry. The treated plate was then baked for 10 minutes at 450° F. in a Wisconsin Oven Corp. plate baking oven.

A Freuendorfer D155-DUO positive acting lithoplate was exposed through a positive half-tone mask in the commercial exposure frame and processed according to the manufacturers instructions. This plate was also treated and baked for 10 minutes at 450° F. in the plate baking oven.

An ENDURA TM negative acting photopolymer plate (3M Corporation) was exposed through a half-tone negative and processed according to the manufacturers instructions.

The three plates were mounted on a Miehle 29 commercial offset press and run to breakdown using an accelerated breakdown test method. The Endura TM plate broke at 15,500 impressions and the baked Freuendorfer D-155-DUO positive plate broke at 17,500 impressions. The plate of this invention was removed from the press at 32,000 impressions with no evidence of image loss.

Reasonable variations and modifications are possible from the foregoing disclosure without departing from either the spirit or scope of the present invention as defined by the claims.

I claim:

1. A process for developing a photoimage comprising exposing the presensitized lithoplate containing a lithographic support coated with a composition comprising:
   (a) the reaction product of a heat reactive phenolic resin and an unsaturated monoisocyanate; and
   (b) a haloalkyl-s-triazine photo sensitizer to ultraviolet light under a negative or positive imaging pattern and thereafter developing the resulting image with an aqueous alkaline solution whereby the areas unexposed are removed.

2. A process according to claim 1 wherein said presensitized lithoplate contains a grained, anodized, non-silicated aluminum sheet.

3. A process according to claim 1 wherein said pattern is negative imaging.

4. A process according to claim 1 wherein said aqueous alkaline solution contains sodium metasilicate.

5. A process according to claim 1 further including the step of (iii) post curing the developed image.

6. A process according to claim 1 wherein said heat reactive phenolic resin is a resolve resin.

7. A process according to claim 1 wherein said unsaturated monoisocyanate is acrylated.

8. A process according to claim 6 wherein said unsaturated monoisocyanate is acrylated.

* * * * *